(12) United States Patent
Amato et al.

(10) Patent No.: US 8,745,463 B2
(45) Date of Patent: *Jun. 3, 2014

(54) ERROR CORRECTING CODES FOR INCREASED STORAGE CAPACITY IN MULTILEVEL MEMORY DEVICES

(71) Applicant: Micron Technology, Inc., Boise, ID (US)

(72) Inventors: Paolo Amato, Pagazzano (IT); Giovanni Campardo, Bergamo (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/712,880

(22) Filed: Dec. 12, 2012

(65) Prior Publication Data

US 2013/0191697 A1   Jul. 25, 2013

Related U.S. Application Data

(63) Continuation of application No. 12/482,400, filed on Jun. 10, 2009, now Pat. No. 8,370,702.

(51) Int. Cl.
*H03M 13/00* (2006.01)

(52) U.S. Cl.
USPC ............................ 714/755; 714/753; 714/764

(58) Field of Classification Search
USPC .......... 714/755, 753, 763, 764, 768, 773, 758
See application file for complete search history.

(56) References Cited

U.S. PATENT DOCUMENTS

| | | | |
|---|---|---|---|
| 4,654,847 A * | 3/1987 | Dutton | 714/6.1 |
| 7,080,309 B2 | 7/2006 | Sharma | |
| 7,305,607 B2 | 12/2007 | Kang et al. | |
| 7,334,159 B1 * | 2/2008 | Callaghan | 714/30 |
| 7,395,482 B2 | 7/2008 | Cideciyan et al. | |
| 7,423,996 B2 | 9/2008 | Son et al. | |
| 7,447,948 B2 | 11/2008 | Galbi et al. | |
| 7,539,052 B2 | 5/2009 | Aritome | |
| 7,656,322 B2 * | 2/2010 | Oda | 341/94 |
| 2008/0028133 A1 | 1/2008 | Kwon | |
| 2008/0137413 A1 | 6/2008 | Kong et al. | |
| 2008/0168320 A1 | 7/2008 | Cassuto et al. | |
| 2009/0024903 A1 | 1/2009 | Bueb | |

FOREIGN PATENT DOCUMENTS

| | | |
|---|---|---|
| EP | 1912121 A1 | 4/2008 |
| EP | 2028661 A1 | 2/2009 |
| JP | 07-170216 | 7/1995 |
| JP | 08-256183 | 10/1996 |

(Continued)

OTHER PUBLICATIONS

English Translation of German Office Action issued on Aug. 6, 2013 for German Patent Application No. 102010021516.3.

(Continued)

*Primary Examiner* — Fritz Alphonse
(74) *Attorney, Agent, or Firm* — Knobbe, Martens, Olson & Bear LLP

(57) ABSTRACT

Embodiments of the present disclosure provide methods, systems, and apparatuses related to multilevel encoding with error correction. In some embodiments, data may be programmed and/or read from a matrix of nonvolatile memory cells with concatenated encoding/decoding schemes. In some embodiments, a calculation module may determine an actual bit per cell value of a given combination of parameters of a nonvolatile memory device. Still other embodiments may be described and claimed.

21 Claims, 8 Drawing Sheets

(56) References Cited

FOREIGN PATENT DOCUMENTS

| JP | 11-143787 | 5/1999 |
|---|---|---|
| JP | 2001-167596 | 6/2001 |
| JP | 2002-009635 | 1/2002 |
| JP | 2002-141810 | 5/2002 |
| WO | WO 01/63613 | 8/2001 |
| WO | WO 2007/084749 | 7/2007 |
| WO | WO 2008/127984 | 10/2008 |

OTHER PUBLICATIONS

English Translation of Chinese First Office Action mailed May 3, 2012 for Chinese Patent Application No. 201010198478.1.

English Translation of Second Office Action issued on Oct. 17, 2012 for Chinese Patent Application No. 201010198478.1.

English Translation of Japanese Office Action mailed Apr. 17, 2012 for Japanese Patent Application No. 2010-114819.

English Translation of Japanese Office Action mailed on Sep. 4, 2012 for Japanese Patent Application No. 2010-114819.

Korean Application, Application No. 10-2010-0054300, Filed Jun. 9, 2010, 41 pages.

Korean Counterpart of US Cited Patent 7,395,482, Document Ref. No. 10-2006-0133997, Dated Dec. 27, 2006, 38 pages.

Korean Counterpart of US Cited Patent 7,432,996, Document Ref. No. 10-0520621, Dated Oct. 10, 2005, 14 pages.

Korean Notice of Preliminary Rejection, Application No. 10-2010-0054300, Filed Jun. 9, 2010, 6 Pages.

English Translation of Korean Notice of Preliminary Rejection, Application No. 10-2010-0054300, Filed Jun. 9, 2010, 5 Pages.

Sun et al., "Design of on-chip error correction systems for multilevel NOR and NAND flash memories", IET Circuits Devices Syst., 2007, 1, (3), pp. 241-249.

\* cited by examiner

ERROR CORRECTING CODES FOR INCREASED STORAGE CAPACITY IN MULTILEVEL MEMORY DEVICES

RELATED APPLICATIONS

This application is a continuation of U.S. patent application Ser. No. 12/482,400, filed on Jun. 10, 2009 and incorporated in its entirety by reference herein.

BACKGROUND

1. Field of the Invention

Embodiments of the present disclosure relate to the field of memory, and more particularly, to error correcting codes for increased storage capacity in multilevel memory devices.

2. Description of the Related Art

In the usual workflow for the development of a nonvolatile memory (NVM) device such as a flash device, error correcting codes (ECCs) are designed after fixing key parameters of the NVM device (e.g., size of technology node, number of bits per cell, etc.). At most, some rough estimate of ECC impact on latency times and logic area are performed.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments in which the disclosure may be practiced. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

Various operations may be described as multiple discrete operations in turn, in a manner that may be helpful in understanding embodiments of the present disclosure; however, the order of description should not be construed to imply that these operations are order dependent.

For the purposes of the present disclosure, the phrase "A and/or B" means "(A), (B), or (A and B)." For the purposes of the present disclosure, the phrase "A, B, and/or C" means "(A), (B), (C), (A and B), (A and C), (B and C), or (A, B and C)."

Various modules and components may be introduced and described in terms of an operation provided by the modules and components. These modules and components may include hardware, software; and/or firmware elements in order to provide the described operations. While some of these modules and components may be shown with a level of specificity, e.g., providing discrete elements in a set arrangement, other embodiments may employ various modifications of elements/arrangements in order to provide the associated operations within the constraints/objectives of a particular embodiment.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The usual workflow for development of a nonvolatile memory (NVM) device described above may be efficient when the number of parity information bits is considerably less than the number of non-parity information bits. However, with the shrinking size of technology nodes and increasing number of bits stored in each cell, the raw bit error rate (BER) becomes greater and greater and, consequently, the number of parity information bits increases. In these situations the purported gain in storage capacity from increasing a number of bits per cell may be offset by a corresponding increase in a number of parity information bits that are desired to achieve a reliability target. This is especially the case when hard-decision ECC solutions, e.g., Hamming and BCH codes, are used. Accordingly, embodiments discussed herein provide metrics and ECC schemes that may be used to increase storage capacity of NVM devices.

Figure 1:
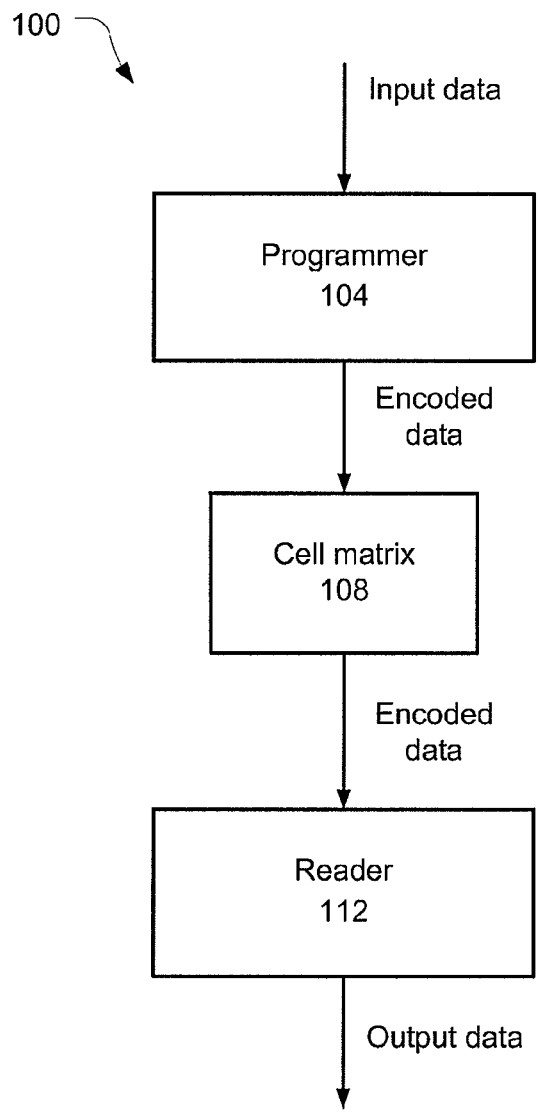
FIG. 1 illustrates a nonvolatile memory device in accordance with an embodiment.

FIG. 1 illustrates an NVM device 100 in accordance with an embodiment. The NVM device 100 may include a programmer 104 that receives input data from, e.g., a host device, encodes the input data, and writes the encoded data into a cell matrix 108 with which it is coupled. The cell matrix 108 may be a matrix of multilevel memory cells that are each formed by a floating gate metal oxide semiconductor (MOS) transistor. In other embodiments, other transistor or transistor-like technologies may be used. In some embodiments, the multilevel memory cells (or simply "cells") may be phase change memory cells.

The NVM device 100 may also include a reader 112 coupled to the cell matrix 108. The reader 112 may access the encoded data stored in the cell matrix 108 by using one or more sense amplifiers to read voltage levels, Vt, of the various cells and determine the logic level, or "cell state" by comparing the voltage levels to one or more threshold values. The cells may have more than two logic levels, or "cell states," determined by the one or more sense amplifiers comparing the Vt of a particular MLC to a plurality of voltage thresholds. Thus, a logic level may correspond to a discrete range of Vt.

After accessing the encoded data, the reader 112 may decode the data in a manner that is complementary to the encoding operation of the programmer 104. The reader 112 may then provide the output data to, e.g., the host device.

In the encoding operation provided by the programmer 104, a number of non-parity information bits, which represent the input data, may be generated along with a number of parity information bits, which may be used to correct errors that may occur in the subsequent retrieval of the non-parity information bits. The non-parity information bits may be written to non-parity cells while the parity information bits may be written to parity cells. There are a number of parameters of the NVM device 100, including the ECC scheme used in the encoding process, that have a bearing on the percentage of parity cells of the cell matrix that are needed to meet target error rates of the NVM device 100. Accordingly, embodiments of the present disclosure provide systems, methods, and apparatuses for selecting the parameters that increase storage capacity of the cell matrix 108 while maintaining desired operating characteristics.

Figure 2:
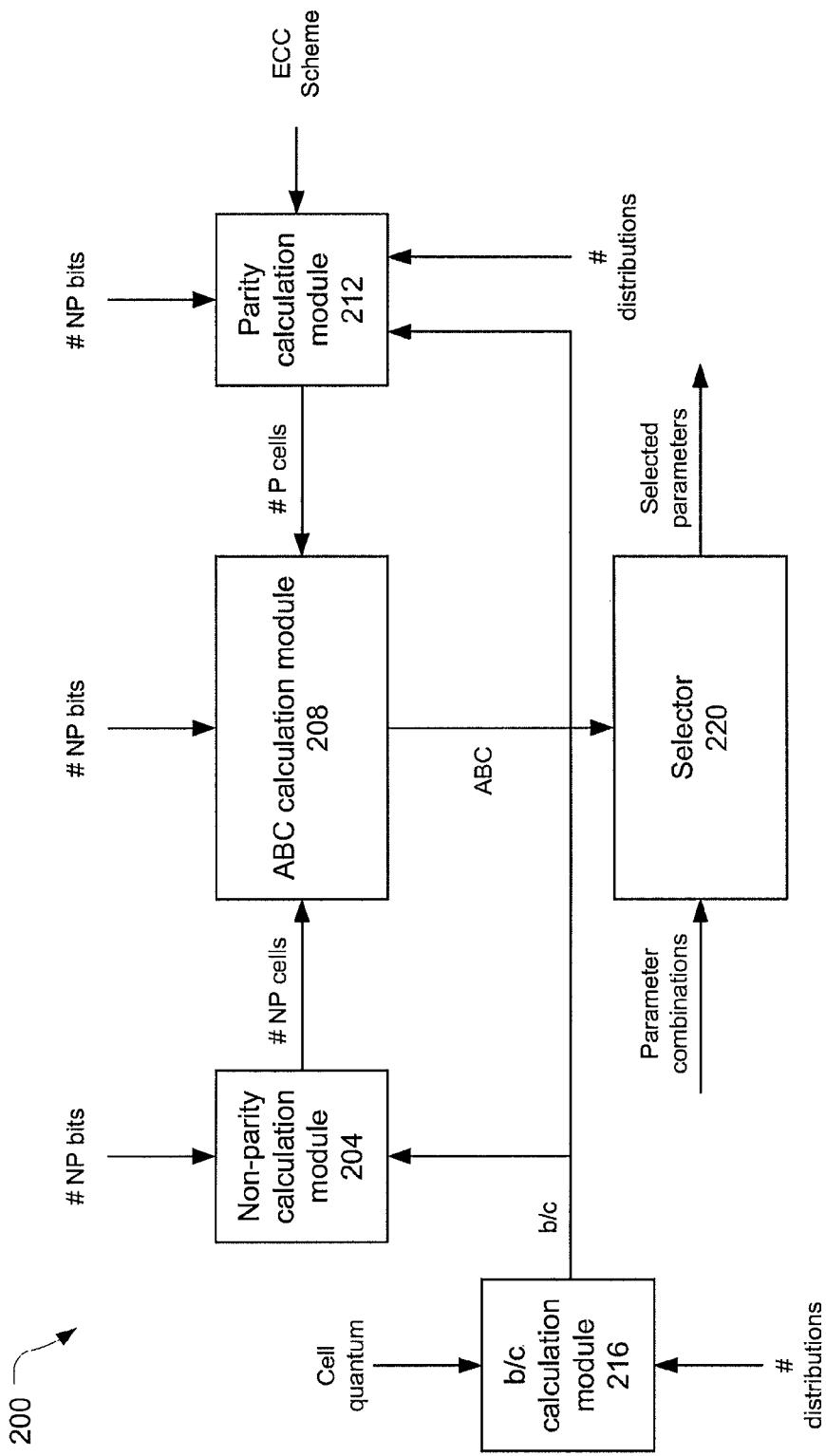
FIG. 2 illustrates a calculation system in accordance with an embodiment.

FIG. 2 illustrates a calculation system 200 that may be used to select parameters of the NVM device 100 in accordance with some embodiments. The calculation system 200 may include four calculation modules: a non-parity calculation module 204, an actual bit per cell (ABC) calculation module 208, a parity calculation module 212, and a nominal bit per cell (b/c) calculation module 216, coupled to each other at least as shown.

Each of these calculation modules may receive respective inputs that are related to a selected combination of parameters of the NVM device 100. In response, each of these calculation modules may provide a respective output that may be used as a direct and/or indirect basis for selecting a desired combination of parameters of the NVM device 100. The calculations provided by these calculation modules may account for the functional interdependence of the various parameters. The metric ABC may facilitate operational comparisons of the various combinations of parameters as will be described below.

Figure 3:
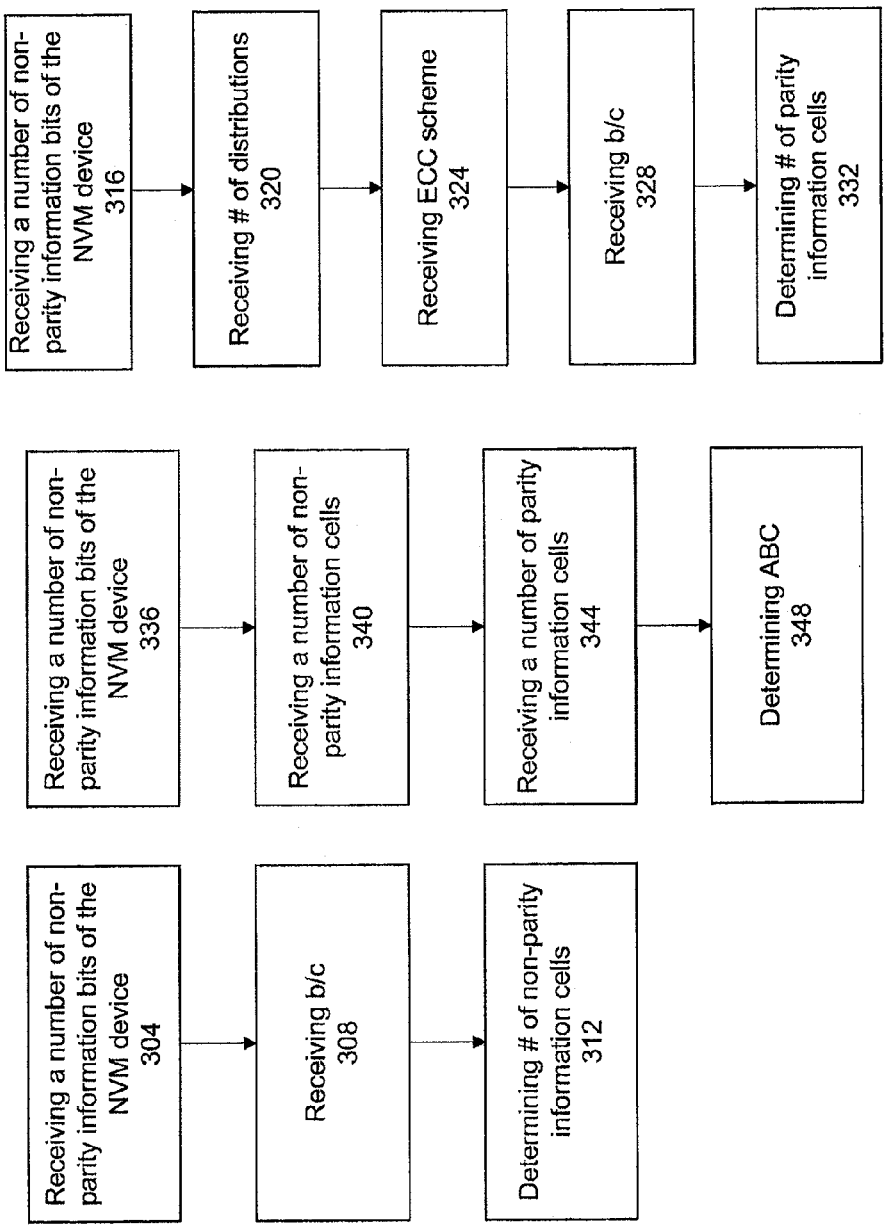
FIGS. 3A, 3B, and 3C are a number of flowcharts illustrating various calculation operations in accordance with an embodiment.
Figure 4:
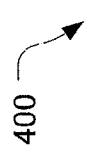
FIG. 4 illustrates a table of combinations of parameters in accordance with an embodiment.

FIGS. 3A, 3B, and 3C include flowcharts describing calculation operations of the various modules of FIG. 2 in accordance with some embodiments. FIG. 4 illustrates a table 400 providing seven different combinations of parameters, and calculated values for each, in accordance with some embodiments.

Referring first to combination A, the b/c calculation module 216 may receive, as inputs, a cell quantum of 1 and a number of distributions of 4. A cell quantum refers to a number of cells that are read together to extract bit information and the number of distributions refers to the number of logical levels of each cell. Given these inputs, the b/c calculation module 216 may determine that the b/c value is 2. That is, each cell may represent an average of two bits.

Referring also to FIG. 3A, the non-parity calculation module 204 may receive, at block 304, a device size of the NVM device 100. The device size may be given as a number of non-parity information bits that the NVM device 100 is capable of storing. In the combinations of table 400 the device size is given as 32,678 Megabits (Mbit): At block 308, the non-parity calculation module 204 may receive the b/c from the b/c calculation module 216. Given these inputs, the non-parity calculation module 204 may determine a number of non-parity cells at block 312. With combination A, the number of non-parity cells may be $16,384 \times 10^6$.

Referring now to FIG. 3C, the parity calculation module 212 may receive the device size of the NVM device 100 at block 316; a number of distributions of the cells of the NVM device 100 at block 320; an ECC scheme to be used in programming/reading data to/from the NVM device 100 at block 324; and a b/c from the b/c calculation module 216 at block 328. The parity calculation module 212 may use these inputs as a basis to determine a number of parity cells at block 332.

In some embodiments, the parity calculation module 212 may determine an ECC value determined based on a BER associated with the number of distributions provided and a target device error rate (DER) for the NVM device 100. Referring to parameters of combination A and assuming that all the distributions have the same width, e.g., 1.3 volts (V), a read window of 5.5 V may be used to accommodate the 4 distributions of a cell. This may result in a BER of around $10^{-5}$. To achieve a DER of 10 parts per million (ppm) given this BER, the parity calculation module 212 may determine a 6 bit ECC value may be used. The ECC value may refer to the number of bits that are capable of being corrected per ECC block, which may be, e.g., 512 non-parity information bytes.

With combination A using BCH codes as the ECC scheme, the parity calculation module 212 may determine that there would be 78 parity information bits per ECC block of 512 non-parity information bytes. This may provide a parity overhead of approximately 2% and result in approximately $328 \times 10^6$ parity cells for the given embodiment.

While certain values may be described as being determined by certain modules in this disclosure, in other embodiments, the given modules may receive the values as inputs from other modules, and vice versa.

Referring now to FIG. 3B, the ABC calculation module 208 may receive the size of the NVM device 100 at block 336; the number of non-parity cells from the non-parity calculation module 204 at block 340; and the number of parity cells from the parity calculation module 212 at block 344. The ABC calculation module 208 may then use these inputs as a basis for determining an ABC at block 348 by the following equation:

$$ABC = (\text{bits of the device})/(\text{non-parity cells} + \text{parity cells}) \quad \text{Equation 1.}$$

Thus, the denominator of Equation 1 represents the true number of cells that are needed to store both the non-parity information bits and the parity information bits that are generated to meet the target DER. The numerator represents the size of the NVM device 100, e.g., the number of non-parity information bits that it is capable of storing. In combination A, the determined ABC may be approximately 1.96.

The ABC values for combinations B-G may be determined in a similar manner. The main variables that may be adjusted among the different combinations are the b/c (including the cell quantum and the number of distributions) and the ECC scheme. Providing different values for these main variables and comparing the resulting ABCs may facilitate a determination of a desired NVM design that will accomplish design objectives of a given embodiment.

In combination B, the number of distributions is increased to 8 and the cell quantum remains at 1 to provide a b/c of 3. In this scenario, the BER becomes 0.02 and a 164 bit ECC value may be needed to achieve the same DER of 10 ppm. This would result in 2028 parity information bits per ECC block, which corresponds to a 49% parity overhead. The calculation system 200 may then determine that the ABC of this scenario is 2.01, which is only slightly larger than the 1.96 ABC of combination A. Thus, the purported gains by moving from 2 b/c to 3 b/c are almost entirely erased by the extra parity information bits needed to achieve the 10 ppm target DER.

In combination D, the number of distributions may be 7 and the cell quantum may be 1 resulting in a 2.67 b/c. In this scenario, a 100 bit ECC value may be needed to achieve the 10 ppm target DER. This results in a 31% parity overhead and an ABC of 2.03. So, while the nominal bits per cell of combination D is less than combination B, the actual bits per cell is greater.

A similar effect may be seen when considering combination F. In this combination, the calculation system 200 may determine that an ABC of 2.15 may be achieved using 2.5 b/c, which results from 6 distributions and a cell quantum of 1.

In this manner, the use of the ABC to factor in the parity costs associated with various parameter combinations may provide a true cost metric by which these combinations may be compared.

In some embodiments, as alluded to above, the ECC scheme may also be adjusted to provide further efficiencies. For example, while the combinations A, B, D, and F all rely on BCH codes, additional gains may be realized by use of a concatenated code as the ECC scheme. Concatenated coding may be used to construct long, powerful ECCs from short component codes. Combinations C, E, and G use a concatenated coding scheme with a trellis code modulation (TCM) as an inner code and Reed Solomon (RS) as an outer code. In other embodiments, other concatenated coding schemes may be used.

Figure 5:
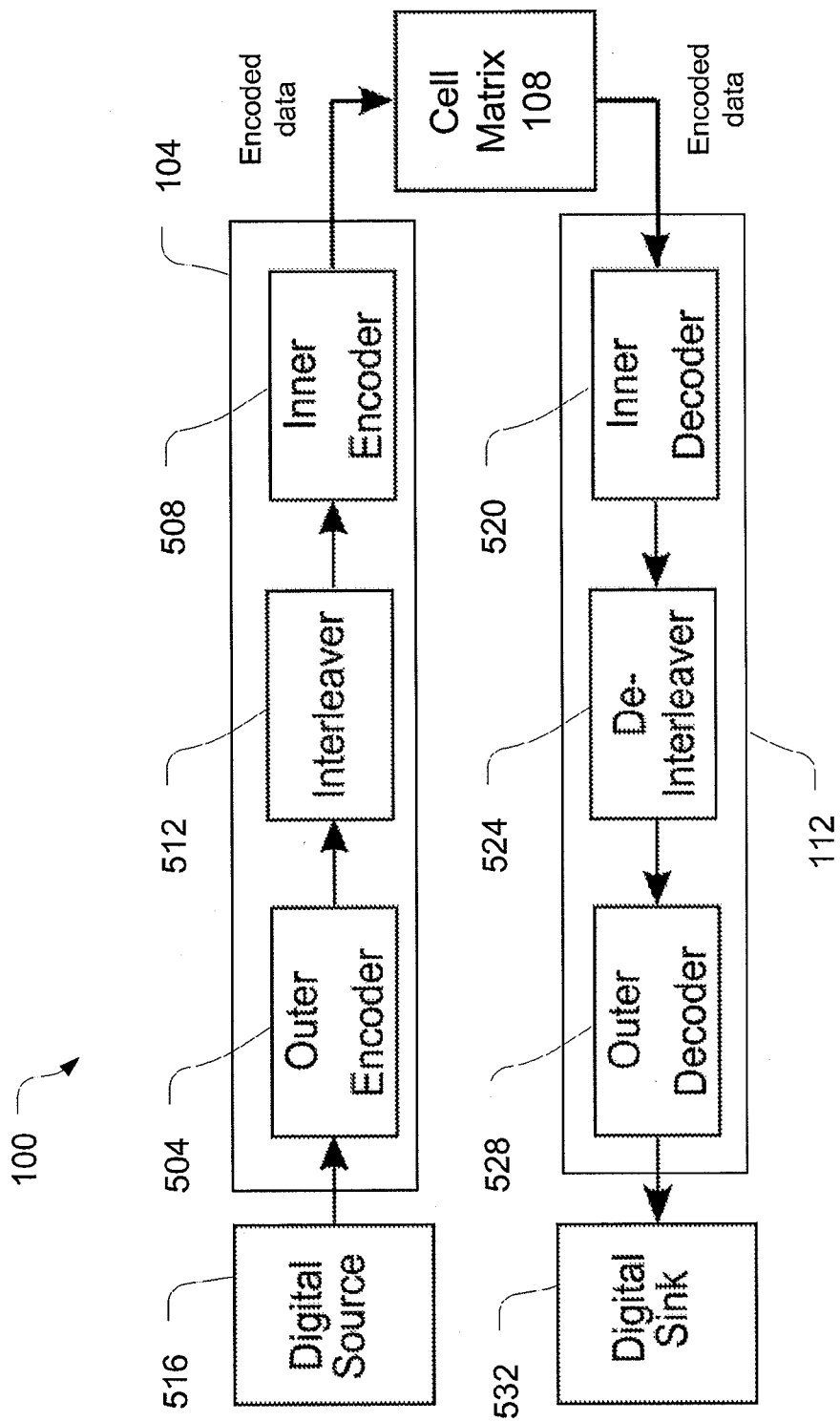
FIG. 5 illustrates the nonvolatile memory device in accordance with an embodiment.

FIG. 5 illustrates the NVM device 100 in further detail in accordance with an embodiment in which the ECC scheme is a concatenated coding scheme. The NVM device 100, and the programmer 104, in particular, may form a concatenated code by using two encoders: an outer encoder 504 that uses a non-binary code and an inner encoder 508 that uses a binary code. The programmer 104 may also include an interleaver 512 between the two encoders.

Figure 6A:
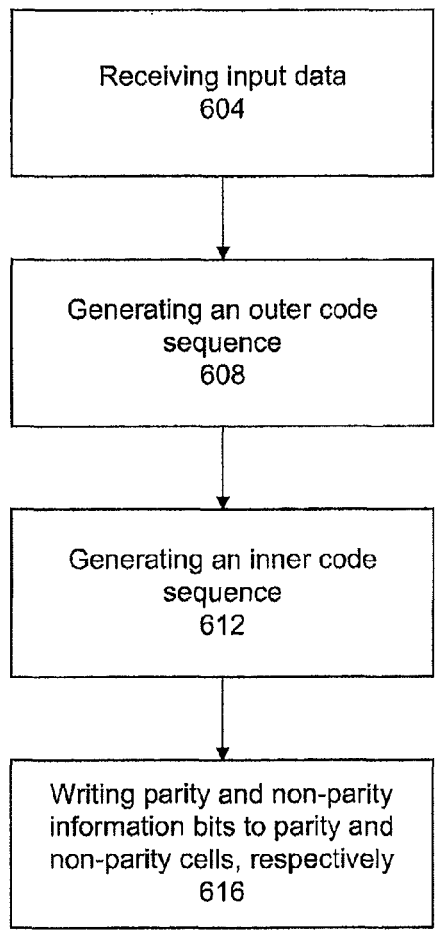
FIGS. 6A and 6B are two flowcharts illustrating an encoding operation and a decoding operation in accordance with an embodiment.

Operation of the programmer 104 may be briefly described in accordance with an embodiment with reference to the flowchart of FIG. 6A. At block 604, the programmer 104 may receive input data from a digital source 516, e.g., a host device. The outer encoder 504 may generate an outer code sequence based at least in part on the input data at block 608. At block 612, the inner encoder 508 may generate an inner code sequence based at least in part on the outer code sequence generated by the outer encoder 504. In some embodiments, as in FIG. 5, an interleaver, e.g., interleaver 512 may interleave the outer code sequence and the inner encoder 508 may generate the inner code sequence based at least in part on the interleaved outer code sequence.

The inner code sequence, which may be referred to as "encoded data" in FIG. 5, may include both parity and non-parity information bits. These parity and non-parity information bits may then be written to parity and non-parity cells, respectively, of the cell matrix 108 at block 616.

Figure 6B:
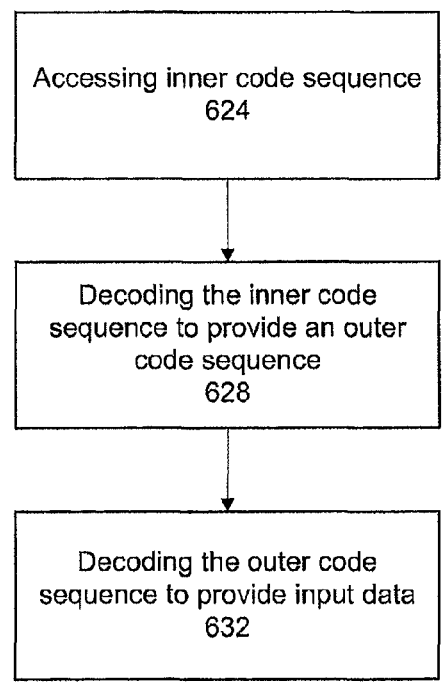

The reader 112 may include an inner decoder 520, a de-interleaver 524, and an outer decoder 528 to operate in a complementary manner to the components of the programmer 104. Operation of the reader 112 may be briefly described in accordance with an embodiment with reference to the flowchart of FIG. 6B.

At block 624, the reader 112 may receive the inner code sequence, e.g., the encoded data or concatenated code sequence, from the cell matrix 108. This may be done by reading the parity information bits from the parity cells and reading the non-parity information bits from the non-parity cells. At block 628, the inner decoder 520 of the reader 112 may decode the inner code sequence to provide an outer code sequence. This may be provided to the outer decoder 528. In some embodiments, the outer code sequence may be de-interleaved by de-interleaver 524 prior to being provided to the outer decoder 528. The outer decoder 528 may decode the outer code sequence to provide input data at block 632. The input data may then be transmitted to a digital sink 532, e.g., the host device.

The concatenated coding used in this embodiment may achieve high reliability with reduced complexity. The inner code sequence generated from the inner encoder 508 may be a short TCM sequence that is decoded by the inner decoder 520 with a soft-decision decoding algorithm, e.g., a Viterbi algorithm. The outer code sequence may be longer than the inner code sequence and may be decoded by the outer decoder 528 with an algebraic decoding method, e.g., an RS code.

The effectiveness of this combination comes from the fact that the inner soft code makes the coding channel, e.g., the programming and reading of values stored in the cell matrix 108, less noisy. In essence, the inner code, e.g., the TCM code, does this by combining ordinary rate $R=k/(k+1)$ binary convolutional codes with an M-ary signal constellation ($M=2^{(k+1)}>2$) in such a way that coding gain is achieved without increasing the rate at which symbols are transmitted. In other words, no additional parity check cells are needed. Then the outer code, by working on a better channel, becomes very effective in "crunching" all the remaining errors. The effectiveness may be further explained with reference to FIG. 7.

Figure 7:
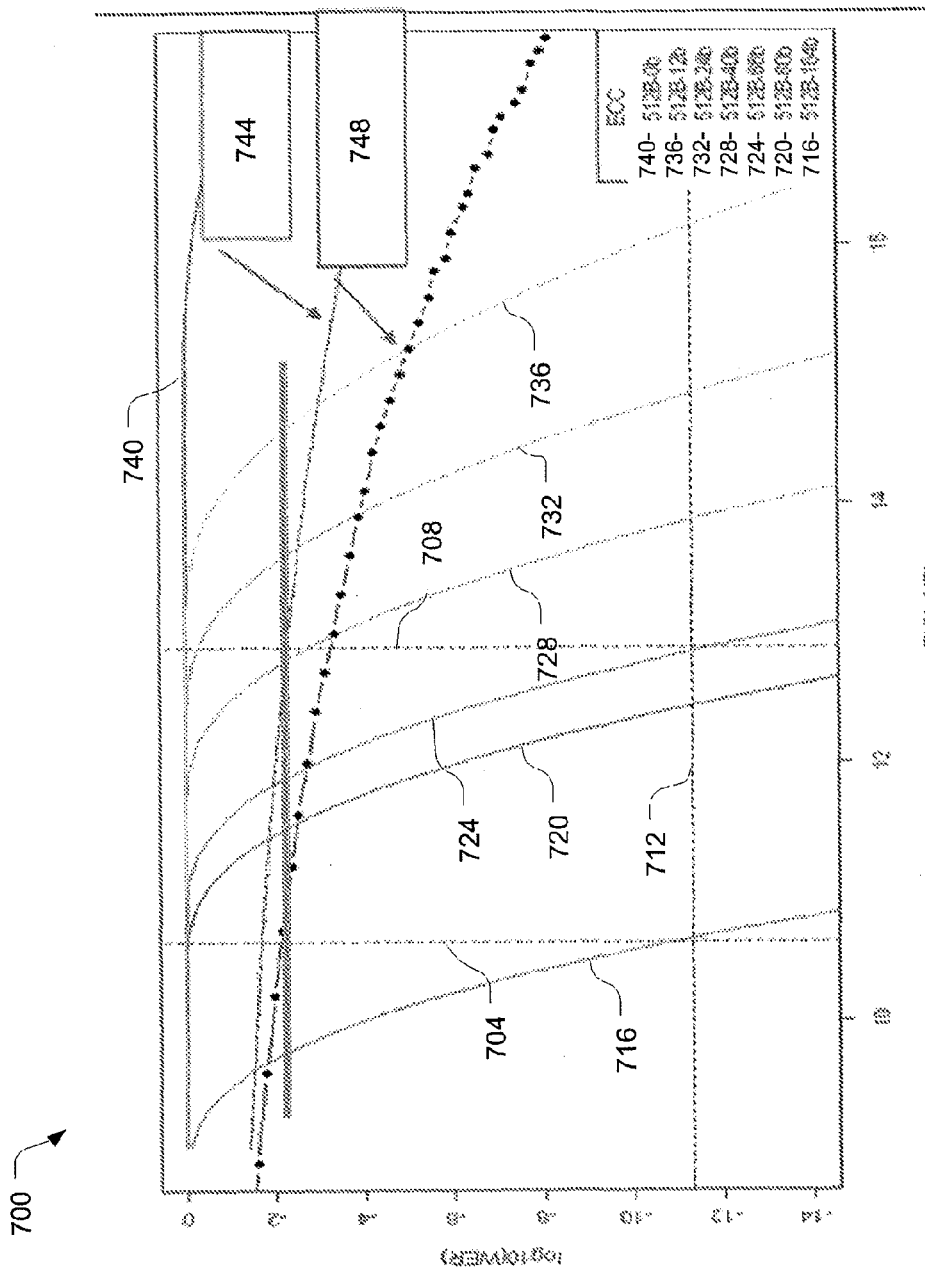
FIG. 7 is a chart graphing error rates against signal-to-noise ratios in accordance with an embodiment.

FIG. 7 is a graph 700 showing error probabilities of a 512 byte ECC block in accordance with some embodiments. In particular, graph 700 charts signal-to-noise ratios (SNRs) to word error rates (WERs) for signals of varying ECC coding schemes and values. The SNRs may be related to the number of distributions and the distribution widths of the cells of the cell matrix 108, while the WERs may be directly proportional to the BERs.

The vertical dashed line 704 represents a first SNR; the vertical dashed line 708 represents a second SNR; and the horizontal dashed line 712 is an error rate of the ECC block to be reached for achieving a target DER of 10 ppm. Lines 716, 720, 724, 728, 732, 736, and 740 respectively correspond to ECC values 164 b, 80 b, 66 b, 40 b, 24 b, 12 b, and 0 b.

Given the SNR of the vertical dashed line 704, which may correspond to an embodiment having 8 distributions for a cell, an ECC value of 164 b (represented by line 716) may be used to achieve the target DER. Thus, an embodiment using a standard BCH code would need an ECC value of 164 b as discussed above with respect to combination B.

However, when using convolutional codes, an inner code, e.g., a TCM code, may provide an SNR gain of approximately 2 dB on the coding channel. Thus, the outer code effectively acts on a coding channel with an SNR relating to the vertical dashed line 708 as opposed to the vertical dashed line 704. This SNR provides the outer decoder 528 with the flexibility of using the 66 b code (represented by line 724).

Lines 744 and 748 respectively show how the BER changes per SNR for an uncoded signal and a convolutionally coded signal. Line 744 represents a real channel condition and line 748 represents a channel conditions seen by a BCH code after application of convolutional codes. As can be seen, the convolutionally coded signal is associated with lower BERs over the range of SNRs.

Referring again to the table 400 of FIG. 4, the combinations that use convolutional codes as an ECC scheme, e.g., combinations C, E, and G, all are associated with ABC values that are greater than 2.2, while the ABC values associated with the combinations that only use BCH codes are all less than 2.2.

In some embodiments, referring again to FIG. 2, the system 200 may include a selector 220 that receives parameter combinations and associated ABC values and selects, based on the ABC values, desired parameters. It may be that the main variables of the parameter combinations may be ECC schemes and nominal bits per cell. Thus, these parameters and/or the underlying parameters that have an effect on these parameters (e.g., # of distributions and cell quantum) may be the selected parameters of these embodiments.

Figure 8:
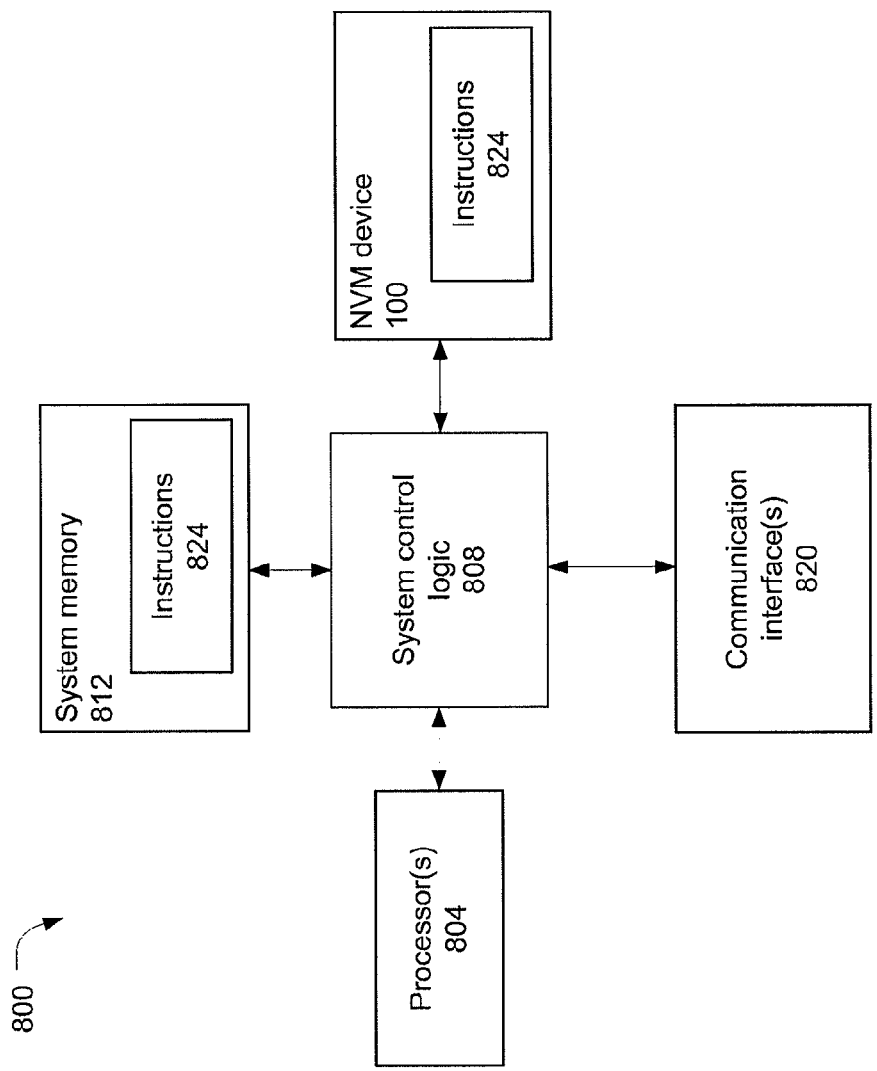
FIG. 8 illustrates a host device incorporating an NVM device in accordance with an embodiment.

FIG. 8 illustrates a host device 800 that may host the NVM device 100 in accordance with some embodiments. The host device 800 may include one or more processors 804; system control logic 808 coupled to at least one of the processor(s) 804; system memory 812 coupled to the system control logic 808; the NVM device 100 coupled to the system control logic 808; and one or more communication interface(s) 820 coupled to the system control logic 808.

System control logic 808 for one embodiment may include any suitable interface controllers to provide for any suitable interface to the components with which it is coupled.

System memory 812 may be used to load and/or store data/instructions, for example, for the host device 800. System memory 812 may include any suitable volatile memory, such as, but not limited to, suitable dynamic random access memory (DRAM).

The NVM device 100 may also be used to load and/or store data/instructions, for example, for the host device 800. The NVM device 100 may include any suitable nonvolatile memory, such as, but not limited to, NOR flash memory, NAND flash memory, phase change memory, etc.

In some embodiments, logic may include instructions 824 that when executed by the processor(s) 804 result in the host device 800 and/or the NVM device 100 performing at least some of the programming, reading, and/or calculating operations described herein. The instructions may be located in the NVM device 100 and/or the system memory 812. In some embodiments, the instructions 824 may additionally/alternatively be located in the system control logic 808.

In some embodiments, the host device 800 may be used to implement the modules of calculation system 200 and not the programming/reading operations of the NVM device 100, itself. In these embodiments, the NVM device 100 may not be included in the host device 800.

Communication interface(s) 820 may provide an interface for the host device 800 to communicate over one or more networks and/or with any other suitable device. Communication interface(s) 820 may include any suitable hardware and/or firmware. Communication interface(s) 820 for one embodiment may include, for example, a network adapter, a wireless network adapter, a telephone modem, and/or a wireless modem. For wireless communications, communication interface(s) 820 for one embodiment may use one or more antennas.

For one embodiment, at least one of the processor(s) 804 may be packaged together with logic for one or more controllers of system control logic 808. For one embodiment, at least one processor of the processor(s) 804 may be packaged together with logic for one or more controllers of system control logic 808 to form a System in Package (SiP). For one embodiment, at least one processor of the processor(s) 804 may be integrated on the same die with logic for one or more controllers of system control logic 808. For one embodiment, at least one processor of the processor(s) 804 may be integrated on the same die with logic for one or more controllers of system control logic 808 to form a System on Chip (SoC).

In various embodiments, the host device 800 may be a desktop or laptop computer, a server, a set-top box, a digital recorder, a game console, a personal digital assistant, a mobile phone, a digital media player, a digital camera, etc. The host device 800 may have more or less components and/or different architectures.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present disclosure. Similarly, memory devices of the present disclosure may be employed in host devices having other architectures. This application is intended to cover any adaptations or variations of the embodiments discussed herein. Therefore, it is manifestly intended that embodiments in accordance with the present disclosure be limited only by the claims and the equivalents thereof.

What is claimed is:

1. An apparatus comprising:
 a matrix of memory cells; and
 a calculation system configured to select an error correction code scheme based at least in part on a first number of non-parity information bits that the matrix is capable of storing, a second number of parity cells of the matrix, and a third number of non-parity cells of the matrix.

2. The apparatus of claim 1, wherein the matrix comprises nonvolatile memory cells.

3. The apparatus of claim 2, wherein the nonvolatile memory cells are configured to have more than two cell states.

4. The apparatus of claim 1, wherein the calculation system determines the third number of non-parity cells of the matrix based at least in part on the first number of non-parity information bits that the matrix is capable of storing and a bit per cell value of the matrix.

5. The apparatus of claim 1, wherein the calculation system determines the second number of parity cells of the matrix based at least in part on the first number of non-parity information bits that the matrix is capable of storing, a number of distributions of the cells of the matrix, the error correction code scheme, and a bit per cell value of the matrix.

6. The apparatus of claim 1, wherein the calculation system determines a number of bits that are capable of being corrected per error correction code block based at least in part on a target device error rate of the matrix and a bit error rate associated with a number of distributions of the cells of the matrix.

7. The apparatus of claim 1, wherein the calculation system selects an actual bit per cell value for the matrix based at least in part on the first number, the second number, and the third number.

8. The apparatus of claim 7, wherein the actual bit per cell value for the matrix is equal to the first number divided by the sum of the second number and the third number.

9. The apparatus of claim 1, wherein the selected error correction code scheme is a concatenated coding scheme.

10. The apparatus of claim 1, further comprising a programmer configured to receive input data, to encode the received input data, and to write the encoded input data to the matrix.

11. The apparatus of claim 10, wherein the programmer is configured to write non-parity information bits of the encoded input data to non-parity cells of the matrix and to write parity information bits of the encoded input data to parity cells of the matrix.

12. The apparatus of claim 1, further comprising a reader configured to read encoded input data from the matrix, to decode the read data, and to output the decoded data to a host device of the matrix.

13. A memory device comprising:
 a matrix of memory cells;
 a programmer configured to write information bits to the matrix;
 a reader configured to read information bits from the matrix; and a calculation system configured to select an error correction code scheme for the programmer to use when writing information bits to the matrix and for the reader to use when reading information bits from the matrix, the calculation system configured to select the error correction code scheme based at least in part on a first number of non-parity information bits that the matrix is capable of storing, a second number of parity cells of the matrix, and a third number of non-parity cells of the matrix.

14. The memory device of claim 13, wherein the calculation system determines the third number of non-parity cells of the matrix based at least in part on the first number of non-parity information bits that the matrix is capable of storing and a bit per cell value of the matrix.

15. The memory device of claim 13, wherein the calculation system determines the second number of parity cells of the matrix based at least in part on the first number of non-parity information bits that the matrix is capable of storing, a number of distributions of the cells of the matrix, the error correction code scheme, and a bit per cell value of the matrix.

16. An apparatus comprising:
a matrix of nonvolatile memory cells;
a calculation system configured to determine an actual bit per cell value for the matrix for each of a plurality of possible combinations of parameters for the matrix; and
a selector configured to receive the actual bit per cell values and to select parameters for the matrix of nonvolatile memory cells based at least in part on the actual bit per cell values.

17. The apparatus of claim 16, wherein the actual bit per cell values are determined by the calculation system based at least in part on a first number of non-parity information bits that the matrix is capable of storing, a second number of parity cells of the matrix, and a third number of non-parity cells of the matrix.

18. The apparatus of claim 16, wherein the apparatus comprises one or more processors, system control logic coupled to at least one of the one or more processors and the matrix of nonvolatile memory cells, system memory coupled to the system control logic, and one or more communication interfaces coupled to the system control logic.

19. The apparatus of claim 18, wherein the system control logic comprises the calculation system and the selector.

20. A nonvolatile memory device comprising:
a matrix of nonvolatile memory cells;
a programmer configured to write information bits to the matrix;
a reader configured to read information bits from the matrix;
a calculation system configured to determine an actual bit per cell value for the matrix for each of a plurality of possible combinations of parameters for the matrix; and
a selector configured to receive the actual bit per cell values and to select parameters for the programmer to use when writing information bits to the matrix and for the reader to use when reading information bits from the matrix, wherein the selector configured to select the parameters based at least in part on the actual bit per cell values.

21. The memory device of claim 20, wherein the actual bit per cell value for the matrix is determined based at least in part on a first number of non-parity information bits that the matrix is capable of storing, a second number of parity cells of the matrix, and a third number of non-parity cells of the matrix.

* * * * *